(12) United States Patent
Gilderdale

(10) Patent No.: US 6,226,545 B1
(45) Date of Patent: May 1, 2001

(54) RF COIL STRUCTURE FOR INTRA-CAVITY USE IN MAGNETIC RESONANCE IMAGING

(76) Inventor: David John Gilderdale, Hummersknott Cottage, Lowerdown, Bovey Tracey, South Devon TQ13 9LF (GB)

( * ) Notice: Subject to any disclaimer, the term of this patent is extended or adjusted under 35 U.S.C. 154(b) by 0 days.

(21) Appl. No.: 09/167,781

(22) Filed: Oct. 7, 1998

(30) Foreign Application Priority Data

Oct. 7, 1997 (GB) .................................................. 9721451

(51) Int. Cl.$^7$ ....................................................... A61B 5/05
(52) U.S. Cl. ........................ 600/423; 600/431; 600/433; 128/899; 128/653.1; 439/909
(58) Field of Search ................. 128/899, 653.1; 600/899, 407, 409, 431, 433, 423; 439/909, 423, 103, 104

(56) References Cited

U.S. PATENT DOCUMENTS

| | | | |
|---|---|---|---|
| 4,766,383 | * | 8/1988 | Fox et al. .............................. 324/318 |
| 5,184,076 | * | 2/1993 | Ehnholm .............................. 324/318 |
| 5,348,010 | * | 9/1994 | Schnall et al. ..................... 128/653.2 |
| 5,379,767 | * | 1/1995 | Derby et al. ....................... 128/653.5 |
| 5,435,302 | * | 7/1995 | Lenkinski et al. ................. 128/653.5 |
| 5,548,218 | * | 8/1996 | Lu ......................................... 324/318 |
| 5,666,055 | * | 9/1997 | Jones et al. ........................... 324/318 |
| 5,699,801 | | 12/1997 | Atalar et al. . |

FOREIGN PATENT DOCUMENTS

WO 96/38083   12/1996   (WO) .

OTHER PUBLICATIONS

N. M. deSouza, et al.; The Uterine Cervix on In Vitro and In Vivo MR Images: A Study of Zonal Anatomy and Vascularity Using an Enveloping Cervical Coil, *Am. Jour. Roentgenology*, 1994; vol. 163, pp. 607–612.

Nandita M. deSouza, et al.; MRI of the Anal Sphincter, *Journal of Computer Assisted Tomography*, 1995, vol. 19, pp. 745–751.

Nandita M. deSouza, A Solid Reusable Endorectal Receiver Coil for Magnetic Resonance Imaging of the Prostate: Design, Use, and Comparison with an Inflatable Endorectal Coil, *Jour. Mag. Resn. Imaging*, 1996, vol. 6, pp. 801–804.

Ergin Atalar, et al.; High Resolution Intravascular MRI and MRS by Using a Catheter Receiver Coil; *Magn. Reson. Med.*, 1996, vol. 36, pp. 596–605 (1996).

* cited by examiner

*Primary Examiner*—Jeoyuh Lin
(74) *Attorney, Agent, or Firm*—Timothy B. Gurin; John J. Fry; Eugene E. Clair

(57) ABSTRACT

An RF coil structure for intra-cavity use includes a pair of conductors (7, 8) separated by a support such as a web (9) which come together at positions separated along the length of the coil structure such as (A, B). Previous coils have included two parallel conductors. If the conductors (7) and (8) were parallel, while the structure could be flexed transverse to the plane of the web (9) about the arrow (10), it could not be flexed in the plane of the web (9) about arrows (12, 13). Because the conductors come together at points (A) and (B), it can be so flexed. A second coil may be provided including conductors (4, 5) and flexing about the same points as for the first coil is still possible because the points of closest approach for one pair come between those for the other pair.

19 Claims, 2 Drawing Sheets

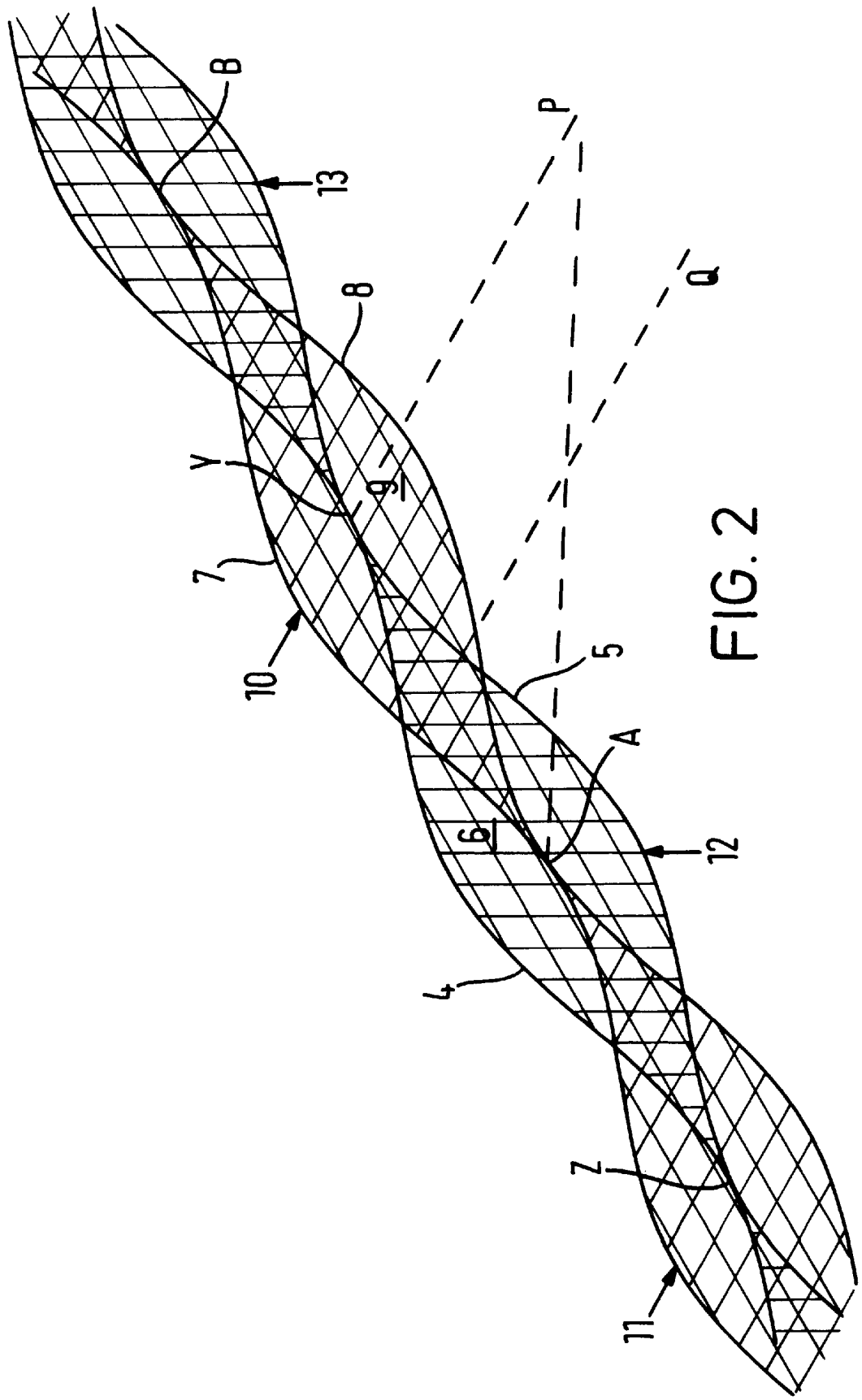

RF COIL STRUCTURE FOR INTRA-CAVITY USE IN MAGNETIC RESONANCE IMAGING

BACKGROUND OF THE INVENTION

This invention relates to RF coil structure for intra-cavity use in magnetic resonance imaging (MRI).

Magnetic resonance imaging is used in medicine to produce images of the internal organs of a patient being examined. In MRI, a static magnetic field is applied to the body of the patient to define an equilibrium axis of magnetic alignment in the region of the body being examined. A radio frequency field is then applied to the region being examined in a direction orthogonal to the static magnetic field direction to excite magnetic resonance in the region. This resonance produces signals in RF coils placed adjacent the body. Normally separate coils are used for excitation and detection, although the same coil or coils may be used for both purposes. The detected signals are processed to produce signals representing an image of the patient's body and this image is visually displayed. In so-called interventional MRI, RF coils are introduced into the body, for example, inside a catheter, which may be passed along the male or female urethra to examine the bladder, or may even be passed down a blood vessel.

There are been a recent growth of interest in the use of MRI RF coil probes within the body so as to exploit the higher local signal to noise ratio (SNR) which may be achieved when compared to external coils.

Such insertable coils may be solid in structure (deSouza N. M., Hawley, I. C., Schwieso J. E., Gilderdale D. J., Soutter W. P., AJR 163: 607–612 (1994); deSouza N. M., Gilderdale D. J., Puni R., et al, JMRI 6: 801–804 (1996); and deSouza N. M., Puni R., Kmoit W. A., et al, J. Comput. Assist Tomogr. 19: 745–751 (1995)), or may be made flexible, as may be advantageous for vascular microscopy (WO-A-96/38083, Atalar E., Bottomley P. A., Ocali O., et al, MRM 36: 596–605 (1996)).

The elongated loop RF coil described in the last mentioned reference is shown in FIG. 1, and consists of a pair of conductors 1, 2 joined by a web 3. The structure has a higher flexibility in the z–y plane than in the z–x plane. Depending on the length of the coil and the radii and direction of the bends to be negotiated, this lack of flexibility may prove to be unacceptable. Flexibility would be improved by the use of a twisted pair but, for adjacent loops, the current induced by the protons during MRI relaxation is in opposite senses (unless the area being imaged is so small that it only lies adjacent to a single loop), so that such a twisted pair would not be able to image anything at a distance from it because of cancellation, and would only be able to image the path of a catheter e.g. down a blood vessel.

SUMMARY OF THE INVENTION

The invention provides an RF coil structure for intra-cavity use in MRI, including an elongate coil comprising a pair of conductors joined by a support, the coil being flexible transverse to the plane of the coil, wherein the spacing between the conductors varies along the length of the coil such that the conductors are close together at positions separated along the length of the coil, whereby flexing of the coil in the plane of the web is also possible.

This structure provides ease of bending of the coil in two mutually perpendicular transverse directions.

The spacing between the conductors may be sinusoidal or trapezoidal or some other pattern.

Advantageously, the coil structure includes a second elongate coil comprising a pair of conductors joined by a second support, the spacing between the conductors of the second coil also varying along the length of the second coil such that the conductors are close together at positions separated along the length of the coil, the close together positions of the second coil lying between the close together positions of the first coil. A single elongate coil will suffer from some loss of signal to noise ratio near the points where the conductors come close together, but the provision of the second coil overcomes this.

BRIEF DESCRIPTION OF THE DRAWINGS

An RF coil structure for intra-cavity use in MRI constructed in accordance with the invention will now be described, by way of example, with reference to FIGS. 2 and 3 of the accompanying drawings, in which:

FIG. 2 shows a length of the RF coil structure; and

DETAILED DESCRIPTION

Figure 1:
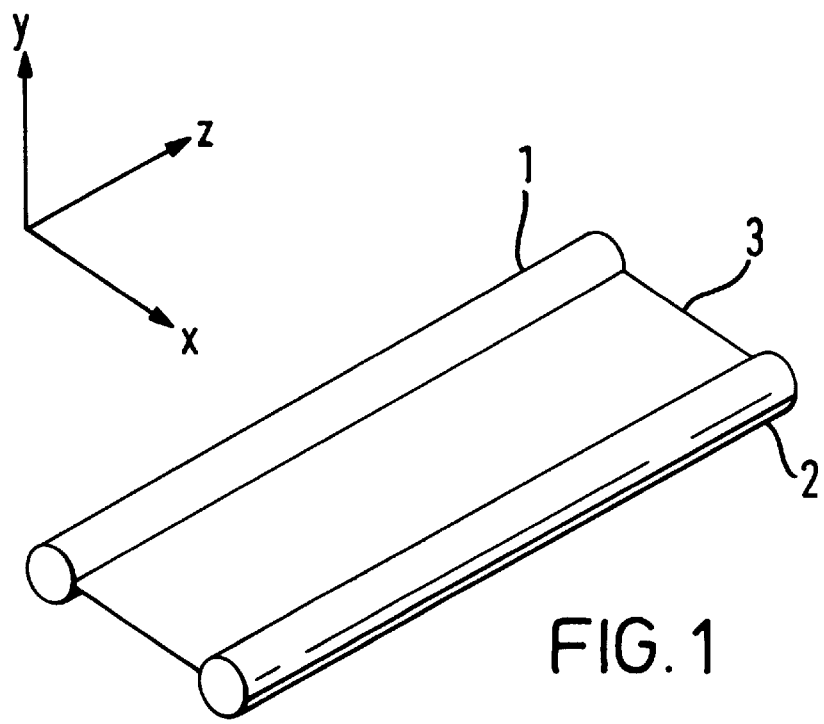
FIG. 1 shows an elongated loop RF coil.

Referring to FIG. 2, the coil structure comprises two elongate coils, one, as seen in the drawing, arranged in the vertical plane and one in the horizontal plane. The coil arranged in the vertical plane in the drawing consists of conductors 4, 5 joined by a support in the form of a web 6. The coil arranged in the horizontal plane as seen in the drawings consists of conductors 7, 8 joined by a support in the form of a web 9. The spacing between each pair of conductors 4, 5 and 7, 8 varies sinusoidally so that the conductors come close together and almost, but not quite touch, at regularly spaced positions A, B, Z, Y along the length of the coil structure. The positions A, B lie between the positions Y, Z etc.

If one just considers the pair of conductors 7, 8 joined by the web 9, i.e. the "horizontal" coil, it will be seen that this coil can flex transverse to the plane of the web 9 where indicated by arrows 10, 11. This indeed was the case with the prior art RF coil structure shown in FIG. 1. Because the conductors 7, 8 come close together at positions A, B, flexing of the "horizontal" coil in the plane of the web 9 is also possible because the structure can be flexed about vertical axes shown by arrows 12, 13 etc. Thus a coil structure consisting of a single coil permits flexing transverse to the length of the coil structure both in horizontal (at 12, 13) and vertical (at 10, 11) directions. This was not possible with the prior art coil structure of FIG. 1. There would be some reduction in signal to noise ratio where the conductors come closest together at positions A, B, but this may not be a disadvantage in some situations. However, in order to improve the signal to noise ratio in case this is desirable, the second, "vertical" coil is provided by the conductors 4, 5 spaced by web 6. These conductors are also sinusoidally spaced and come close together and nearly but do not quite touch at points Y, Z. Because the "vertical" sinusoid is displaced from the "horizontal" sinusoid by 90°, flexing transverse to the plane of the web 9 at arrows 10, 11 is still possible and flexing in the plane of the web 9 at arrows 12, 13 is also still possible.

Figure 3:
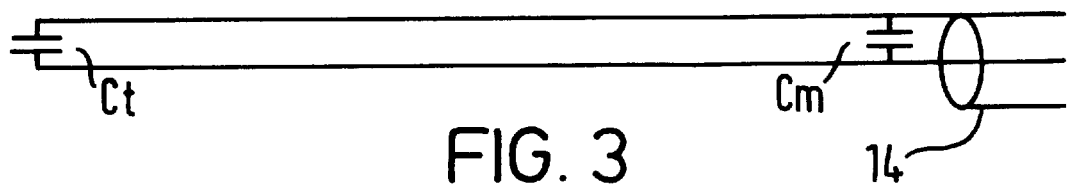
FIG. 3 shows the connections at the end of one of the coils.

Referring to FIG. 3, each of the two coils may be terminated at one end in a tuning capacitor $C_t$ so that when in use in a body cavity the coil is tuned to the frequency of magnetic resonance, and at the other end in a matching capacitor $C_m$ to match to co-axial cable 14 connected to electronic apparatus for processing the magnetic resonance signals.

Each of the two channels in the electronic processing apparatus measures the amplitude and phase of the signal induced in the respective coil.

There are two modes in which the signals can be used. In the first mode, the amplitudes are added in order to obtain increased signal-to-noise ratio. Referring to FIG. 2, if point P is distant from the coil, in the sense that PY is greater than PA, then to a first order of approximation, point P is equally spaced from the centres of the loops defined by conductors 4, 5 centred on point A, and by conductors 7, 8 centred on point Y. Magnetic resonance signals produced by tissue at point P will produce substantially equal signals in both coils, increasing the signal-to-noise ratio produced with a single coil. The two coils may therefore in a first mode be used to image material spaced from the coil structure.

In a second mode, the amplitudes from the coils can be subtracted from each other.

For points P which are distant from the coil structure in the sense that PY is greater than PA, magnetic resonance signals from tissue in this region will not be imaged since the subtraction will produce a close to zero result.

For points P which are near to the coil structure, in the sense that PY is less than PA, the signal induced in the loop centred on Y will dominate over that induced in the loop centred on A, and a net signal will be produced by the subtraction.

Thus, magnetic resonance signals of protons (e.g. in water such as in blood or urine, or in tissue) will be sensed by the coil structure when used in the subtraction mode.

Thus, the coil structure can be used as a probe in order to guide the coil structure to a desired position. For example, a patient in a magnetic resonance imaging apparatus could be imaged using an external coil and a fast scanning sequence with the result visible on an LCD display adjacent the magnetic resonance imaging apparatus. The coil structure could be inserted into a desired part of the anatomy e.g. a blood vessel so that the blood in the vessel was being imaged, and the tip of the coil could be viewed on the display, which could be updated so that the tip of the coil structure stays in the imaging plane. This would then facilitate the insertion of the coil structure to a desired location e.g. plaque or a blockage in the blood vessel. Having been inserted to this position, the processing electronics could be switched to an additive mode to image e.g. tissue outside the blood vessel.

It should be added that the image of blood in a vessel in a subtractive mode, would appear as a series of bright dots, since close-up regions imaged along line Q would produce an equal signal in each coil and would substantially cancel.

It might be found desirable to mould the structure into a tubular structure having as its diameter the peak to peak of the sinusoids. For example, the spaces could be filled with flexible silicone rubber. The tubular structure thus formed could if desired be coated eg. with PTFE.

The web, the purpose of which is to maintain the separation of the conductors, is an insulating material which could be polypropylene, or PTFE, which would have lubrication advantages. A typical thickness could be 5–10 thousandths of an inch. The overall coil structure could have an overall diameter from the range of a millimeter to a centimeter or more, depending on the application. The tuning capacitor is chosen to provide the desired resonant frequency of the coil, typically in the range 5 MHz to 100 MHz. The matching capacitor may be chosen to match the coil to 50 ohms. The tuning capacitor and the matching capacitor would be set while being manufactured, thereby saving adjustment time in use of the coil structure. Typically, the conductors would be coated for example with PTFE, but this might not be necessary if they are set into a structure, tubular or otherwise, with flexible rubber.

The coil structure described is particularly suited for use as a receiving coil, in which case some form of de-coupling would be necessary, but could be used for transmitting as well, or indeed as a transmit only coil.

The coil structure would normally be inserted into a catheter which was already inserted in a patient, although if the structure was moulded in a tube, it could be inserted on its own without the preliminary insertion of a catheter.

The wavelength of the undulations can be varied. The shorter the wavelength, the closer to the coil matter is imaged in a subtractive mode.

Variations are of course possible without departing from the scope of the invention. Thus, for example, the pairs of conductors need not be sinusoidally spaced, but could be spaced according to another function e.g. a repeating trapezoid. The loss of signal to noise due to width variation could be reduced because the close together portions could be shorter along the length of the coil structure. There is no need to have two coils, a single coil could be used for the coil structure. In the latter case, instead of the conductors almost touching, they could be spaced a little further apart than that, because there is a trade-off between flexibility and signal to noise at the narrowest approach. Further, it might be found desirable to mould the conductors directly into a tubular structure of flexible material such as silicone rubber, without providing a web or webs at all, the flexible material providing sufficient support to maintain the spacing of the conductors. This would apply whether one or two coils were used.

From the above description of the invention, those skilled in the art will perceive improvements, changes and modification. Such improvements, changes and modification within the skill of the art are intended to be covered by the appended claims.

Having described a preferred embodiment of the invention, the following is claimed:

1. An RF coil structure for intra-cavity use in MRI comprising:
   a pair of conductors joined by a support, the conductors forming a first elongate coil adapted for intra-cavity use, the coil being flexible transverse to the plane of the coil, wherein the spacing between the conductors varies along the length of the coil such that the conductors are close together at positions separated along the length of the coil, whereby flexing of the coil in the plane of the support is also possible.

2. An RF coil structure as claimed in claim 1, wherein the coil structure includes a second elongate coil adapted for intra-cavity use, the coil comprising a pair of conductors joined by a support, the spacing between the conductors of the second coil also varying along the length of the second coil such that the conductors are close together at positions separated along the length of the coil, the close together positions of the second coil lying between the close together positions of the first coil.

3. The RF coil structure of claim 1, wherein the spacing between the conductors of the elongate coils is sinusoidal.

4. The RF coil structure of claim 1, wherein the support is a web.

5. The RF coil structure of claim 1, wherein the pairs of conductors are embedded in a tubular structure of flexible material.

6. The RF coil of claim 2 including means to combine the outputs of the first and second elongate coils.

7. The RF coil of claim 6 wherein the outputs of the first and second elongate coils are combined additively.

8. The RF coil of claim 2 wherein the plane including the first pair of conductors intersects the plane including the second set of conductors at an angle.

9. The RF coil of claim 8 wherein the angle that the planes intersect is approximately 90°.

10. An elongate RF coil for intra-cavity use in magnetic resonance imaging, the coil comprising:

RF coil means for conducting RF energy in intra-cavity MR Imaging, the coil including:
A first pair of conductors supported in a spaced non-intersecting relation to each other that varies periodically between a first maximum and a first minimum distance between the conductors.

11. The RF coil of claim 10 wherein each of the conductors are arranged in a sinusoidal path.

12. The RF coil of claim 11 wherein the sinusoidal paths of the respective conductors are approximately 180° out of phase.

13. The RF coil of claim 10 wherein the first pair of conductors is supported by a web of material, and wherein the coil is a receive-only coil.

14. The RF coil of claim 10 wherein the first pair of conductors is supported in a tubular structure.

15. The RF coil of claim 14 wherein the tubular structure is filled with flexible silicone rubber.

16. The RF coil of claim 10 further including a second pair of conductors supported in a spaced relation to each other that varies between a second maximum distance and a second minimum distance, portions of the second pair of conductors supported in a plane different than the plane of portions of the first conductors at the same location along the length of the conductor.

17. The RF coil of claim 16 further including means to combine the signals from the first and second pairs of conductors to increase the signal-to-noise ratio produced in at least one of the first pair of conductors and second pair of conductors.

18. The RF coil of claim 16 including means to combine the outputs of the first and second pair of conductors.

19. An elongate RF coil for intra-cavity use in magnetic resonance imaging, the coil comprising:

a first pair of conductors supported in a varying spaced relation to each other, each conductor having crests and troughs arranged in a mirrored relationship with the other conductor about a first axis; and a second pair of conductors supported in a varying spaced relation to each other, each conductor having crests and troughs arranged in a mirrored relationship with the other conductor about the first axis, wherein points in the first pair of conductors are supported in a first plane different than a second plane including points of the second conductors at the same location along the length of the conductor.

* * * * *